(12) United States Patent
Lee et al.

(10) Patent No.: US 7,986,529 B2
(45) Date of Patent: Jul. 26, 2011

(54) MOUNTING APPARATUS FOR HEAT DISSIPATING DEVICE

(75) Inventors: Sheng-Hung Lee, Taipei Hsien (TW); Li-Ping Chen, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 221 days.

(21) Appl. No.: 12/482,900

(22) Filed: Jun. 11, 2009

(65) Prior Publication Data

US 2010/0259892 A1 Oct. 14, 2010

(30) Foreign Application Priority Data

Apr. 10, 2009 (CN) ...................... 2009 2 0302071 U

(51) Int. Cl.
*H05K 7/20* (2006.01)
*F28F 7/00* (2006.01)
*H01L 23/34* (2006.01)

(52) U.S. Cl. ......... 361/719; 165/185; 257/719; 361/720

(58) Field of Classification Search ........... 361/719–720
See application file for complete search history.

(56) References Cited

U.S. PATENT DOCUMENTS

| 6,639,804 | B1 * | 10/2003 | Chen .............................. 361/719 |
| 6,885,557 | B2 * | 4/2005 | Unrein ........................... 361/704 |
| 7,042,727 | B2 * | 5/2006 | Ulen et al. ..................... 361/704 |
| 7,254,028 | B2 * | 8/2007 | Lee et al. ....................... 361/704 |
| 7,277,293 | B2 * | 10/2007 | Yang et al. ..................... 361/719 |
| 7,330,358 | B2 * | 2/2008 | Chen et al. ..................... 361/810 |
| 7,336,496 | B1 * | 2/2008 | Hsu .............................. 361/719 |
| 7,342,809 | B2 * | 3/2008 | Chen et al. ..................... 361/801 |
| 7,443,682 | B2 * | 10/2008 | Fan et al. ....................... 361/709 |
| 2005/0168959 | A1 * | 8/2005 | Chen et al. ..................... 361/752 |

* cited by examiner

*Primary Examiner* — Gregory D Thompson
(74) *Attorney, Agent, or Firm* — D. Austin Bonderer

(57) ABSTRACT

An apparatus includes a base plate, a circuit board mounted on the base plate, and a supporting bracket adapted to support a heat dissipating device. A securing post protrudes from the base plate and defines a securing groove. The supporting bracket is disposed above the circuit board. Two elastic securing claws extend from the supporting bracket. The securing post is wrapped by the two elastic securing claws, and the securing claws engage the securing groove of the securing post.

17 Claims, 4 Drawing Sheets

MOUNTING APPARATUS FOR HEAT DISSIPATING DEVICE

BACKGROUND

1. Technical Field

The present disclosure relates to mounting apparatuses, and particularly, to a mounting apparatus for a heat dissipating device.

2. Description of Related Art

A heat dissipating device is an important component mounted in a computer system, and is used for removing heat generated by electronic components on a circuit board of the computer system. Generally, the heat dissipating device is secured to a supporting bracket first. Then, the supporting bracket is mounted to the circuit board. Thus, the heat dissipating device and the bracket are together directly supported by the circuit board. However, such a method for securing the heat dissipating device puts the weight of the supporting bracket and the heat dissipating device on the circuit board, so that the circuit board may be overloaded. When this happens, the circuit board performance will be affected.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
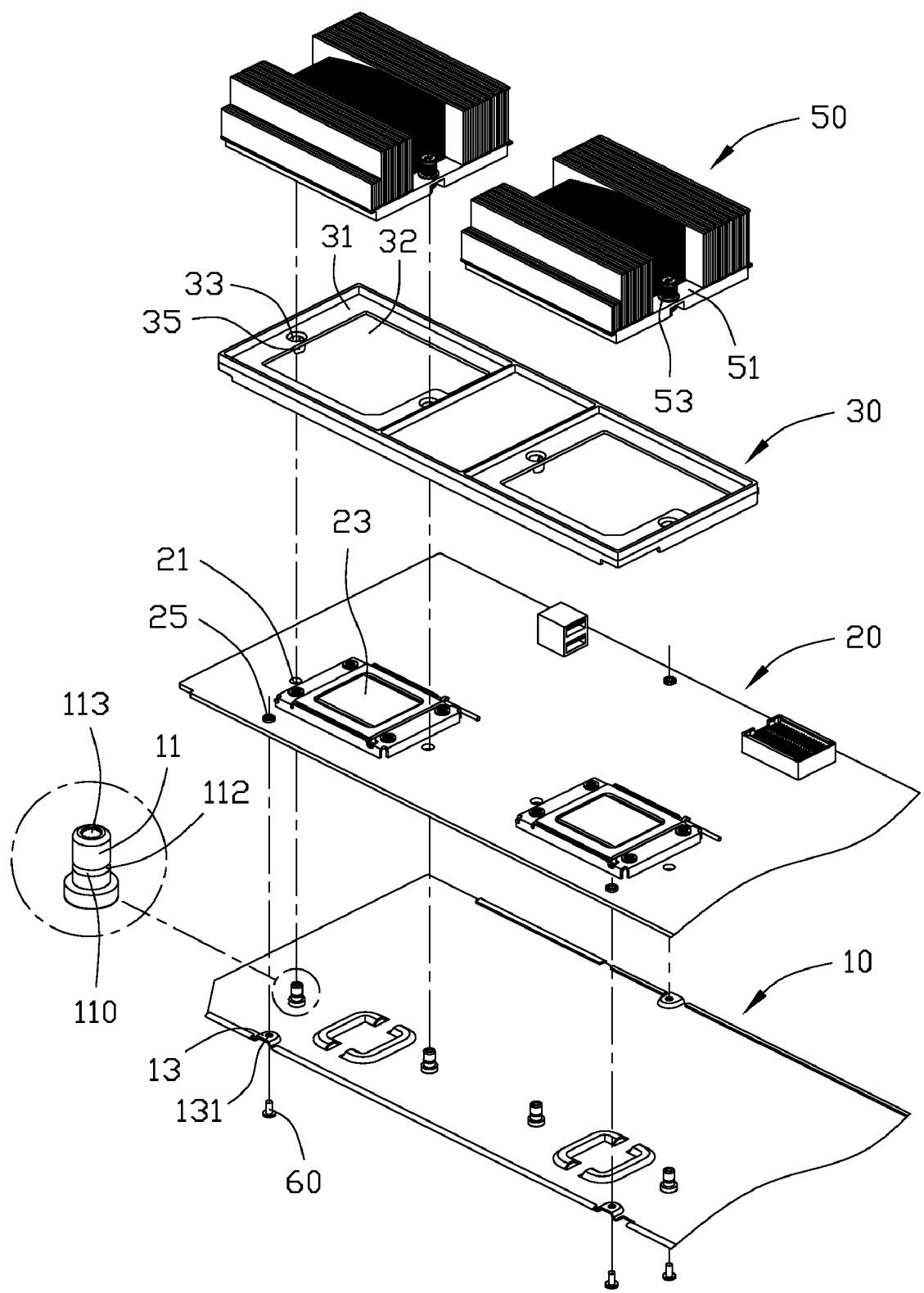
FIG. 1 is an exploded, isometric view of one embodiment of a mounting apparatus and a heat dissipating device.
Figure 2:
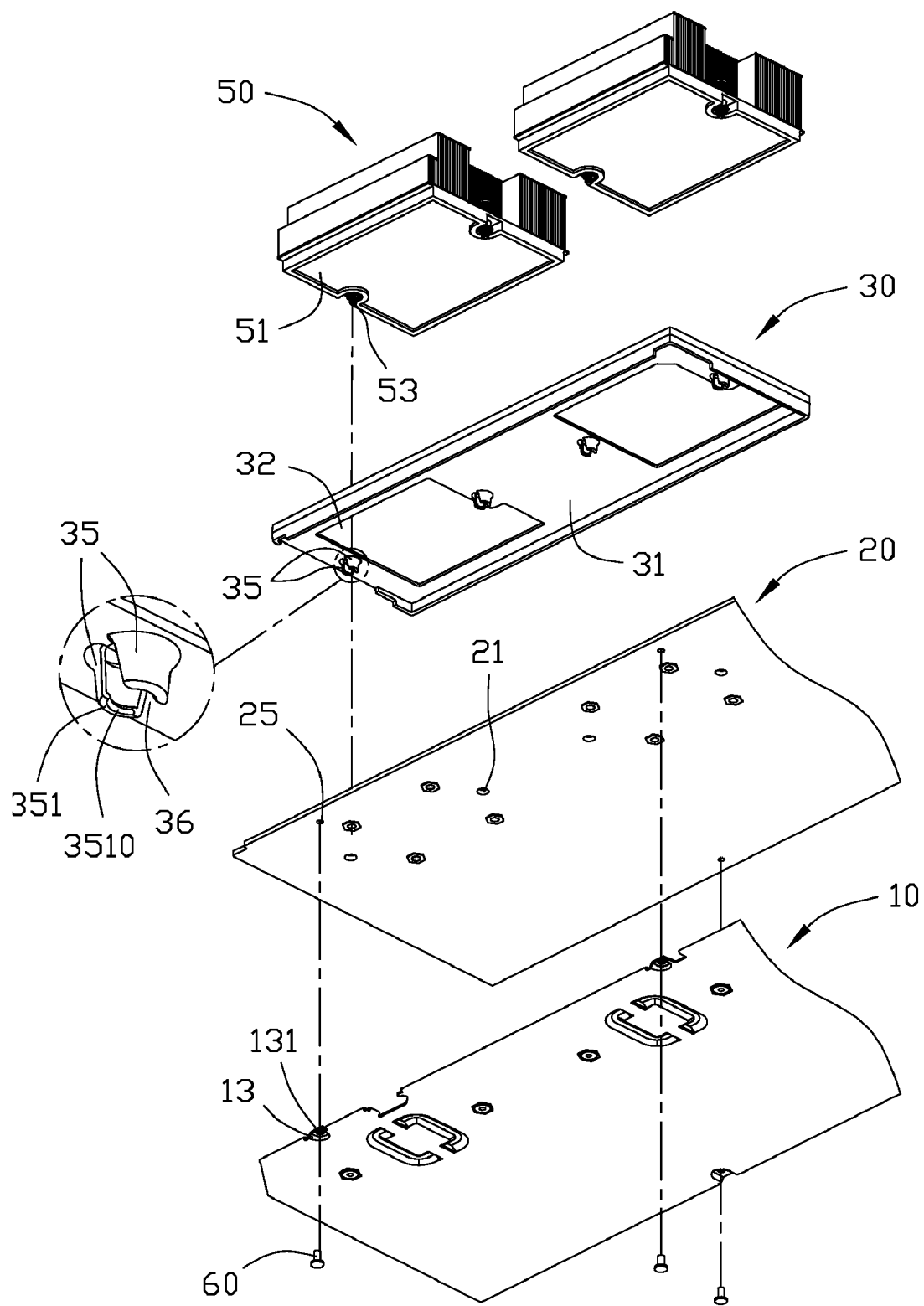
FIG. 2 is similar to FIG. 1, but viewed from another aspect.

Referring to FIGS. 1 and 2, one embodiment of a mounting apparatus for heat dissipating devices 50 includes a base plate 10, a circuit board 20 mounted on the base plate 10, and a supporting bracket 30 attached to the base plate 10. The supporting bracket 30 is configured for mounting the heat dissipating devices 50. Each of the heat dissipating devices 50 includes a seat 51 and two spring fasteners 53 resiliently mounted on the seat 51. In the following description, only one heat dissipating device 50 is described.

The base plate 10 includes two cylindrical securing posts 11 spacedly protruding from the base plate 10. Each securing post 11 defines a securing groove 112 in the circumference thereof, and thereby forming a support flange 110. A securing hole 113 is defined in a top center of the securing post 11. A plurality of standoffs 13 protrudes from opposite side edges of the base plate 10. Each standoff 13 defines a securing hole 131.

The circuit board 20 defines through holes 21 corresponding to the securing posts 11 on the base plate 10. The through holes 21 are configured for the securing posts 11 extending through. A chip 23 is located on the circuit board 21 between the two through holes 21. A plurality of securing holes 25 is defined in the circuit board 20 corresponding to the securing holes 131 in the base plate 10. A plurality of fasteners 60 correspondingly extends through the securing holes 25 and 131 to secure the circuit board 20 on the base plate 10.

The supporting bracket 30 includes a frame 31 for supporting the heat dissipating device 50. An opening 32 corresponding to the chip 23 on the circuit board 20 is defined in the frame 31. The opening 32 has a size less than that of the heat dissipating device seat 51 and greater than that of the chip 23, so that the chip 23 is entirely exposed to the heat dissipating device seat 51 from the opening 32 when the heat dissipating device 50 is mounted to the supporting bracket 30, to efficiently remove heat generated by the chip 23. Two mounting holes 33 corresponding to the through holes 21 in the circuit board 20 are defined in the frame 31 at opposite sides of the opening 32. Two elastic securing claws 35 extend downward from opposite arc-shaped edges of each mounting hole 33. Each of the elastic securing claws 35 has an arc-shaped profile. A blocking flange 351 is bent from a bottom end of each elastic securing claw 35, and forms a guiding plane 3510 oblique to the blocking flange 351. External diameter of each securing post 11 on the base plate 10 is less than the diameter of the mounting hole 33 and greater than a maximum distance between the two blocking flanges 351, so that the blocking flange 351 is capable of firmly engaging in the securing groove 112 of the securing post 11. An accommodating space 36 is defined between the two elastic securing claws 35, and configured to receive the securing post 11.

Figure 3:
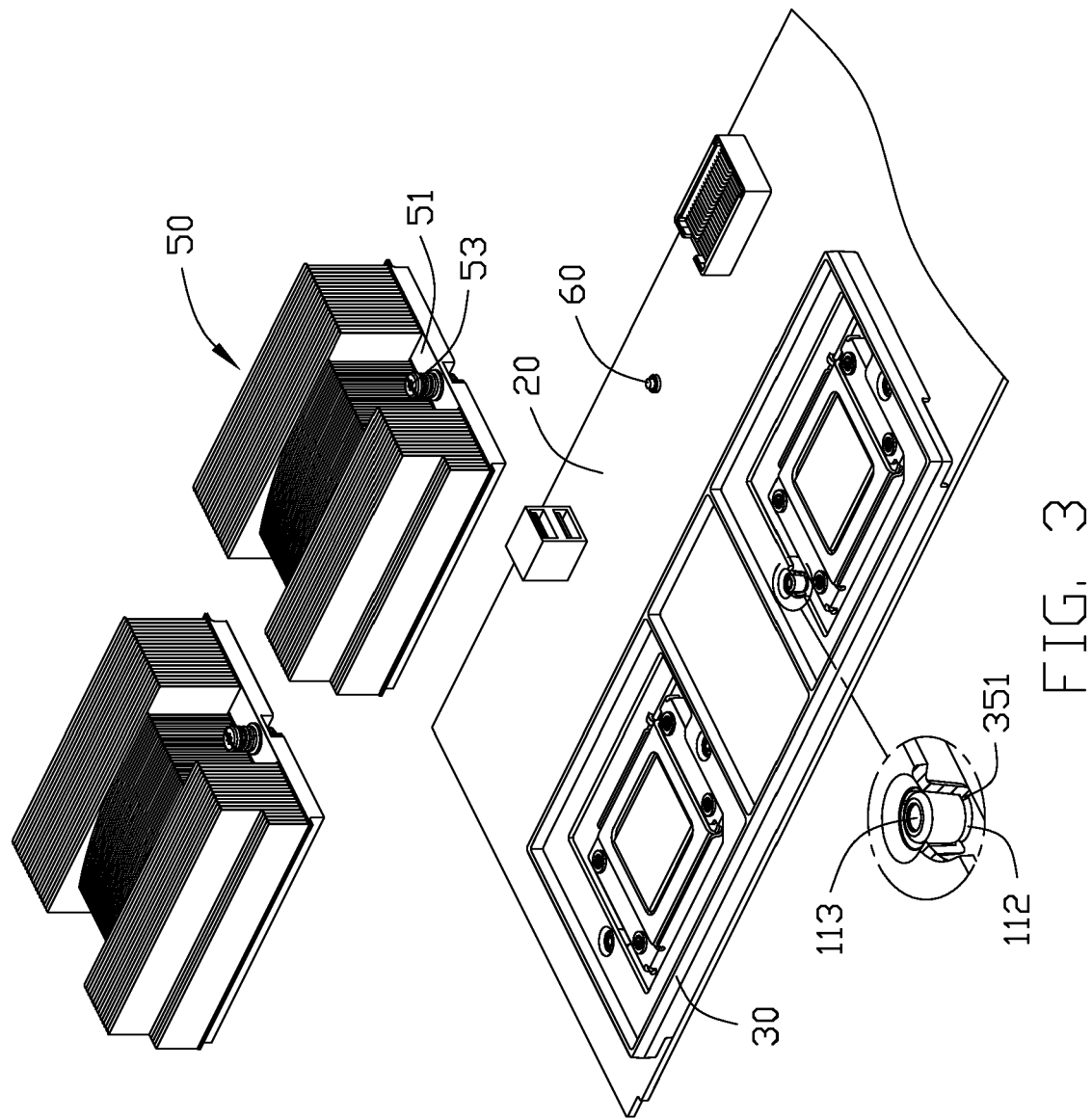
FIG. 3 is similar to FIG. 1, but showing the mounting apparatus partially assembled.
Figure 4:
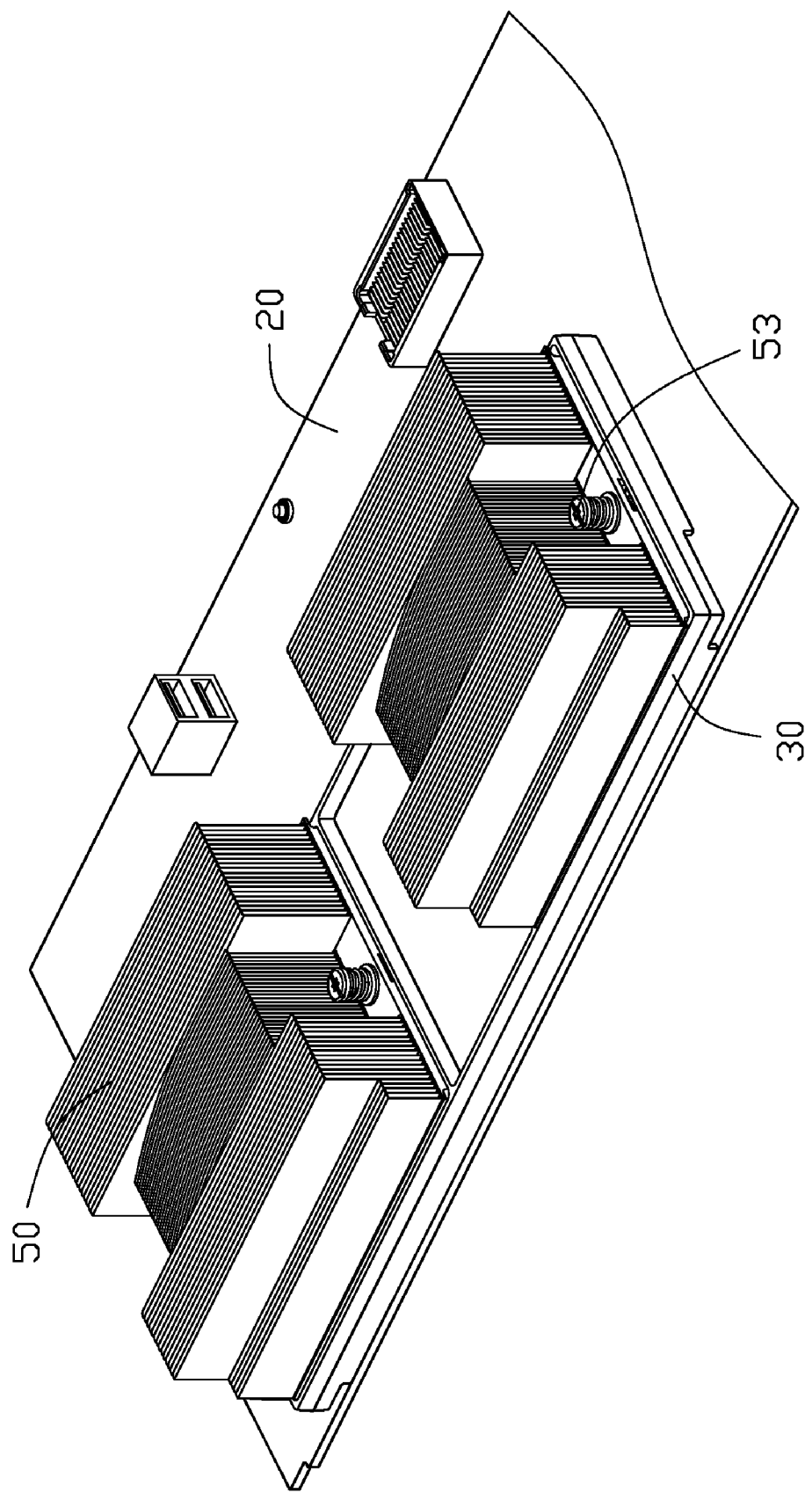
FIG. 4 is an assembled view of FIG. 1.

Referring to FIGS. 3 and 4, in assembly, the circuit board 20 is secured to the base plate 10 via the fasteners 60. The securing posts 11 on the base plate 10 extend through the through holes 21 in the circuit board 20. Then, the accommodating spaces 36 are aligned with the securing posts 11 on the base plate 10. The supporting bracket 30 is pushed down. The securing posts 11 enter into the accommodating spaces 36 from the guiding planes 3510 to resiliently deflect the elastic securing claws 35. Then, the blocking flanges 351 slide along external surfaces of the securing posts 11. When the blocking flanges 351 of the elastic securing claws 35 are aligned with the securing grooves 112, the elastic securing claws 35 rebound to bias the blocking flanges 351 to engage in the securing grooves 112 of the securing posts 11. The blocking flanges 351 are supported on the support flanges 110 of the securing posts 11.

Then, the heat dissipating device 50 is disposed on the frame 31 of the supporting bracket 30, with the seat 51 covering the opening 32 in the supporting bracket 30 and abutting the chip 23 on the circuit board 20. The spring fasteners 53 extend through the mounting holes 33 in the supporting bracket 30 and engage in the securing holes 113 in the securing posts 11, to secure the heat dissipating device 50 and the supporting bracket 30 to the base plate 10. Thus, the supporting bracket 30 and heat dissipating device 50 are directly supported by the securing posts 11 and not contact the circuit board 20, weight of the heat dissipating device 50 and the supporting bracket 30 is loaded on the securing posts 11 of the base plate 10.

It is to be understood, however, that even though numerous characteristics and advantages of the embodiments have been set forth in the foregoing description, together with details of the structure and function of the present disclosure, the disclosure is illustrative only, and changes may be made in detail, especially in matters of shape, size, and arrangement of parts within the principles of the embodiments to the full extent indicated by the broad general meaning of the terms in which the appended claims are expressed.

What is claimed is:

1. An apparatus, the apparatus comprising:
a base plate, at least one securing post protruding from the base plate and defining a securing groove;

a circuit board mounted on the base plate, and having the at least one securing post extending through the circuit board; and a supporting bracket capable of supporting a heat dissipating device, the supporting bracket being disposed above the circuit board, at least two elastic securing claws extending from the supporting bracket, the at least one securing post being wrapped by the at least two elastic securing claws, and the at least two securing claws engaging the securing groove of the securing post.

2. The mounting apparatus of claim 1, wherein the securing post is cylindrical, the securing groove is defined about the circumference of the securing post.

3. The mounting apparatus of claim 2, wherein a mounting hole is defined in the supporting bracket between the two elastic securing claws, and the elastic securing claws extend from opposite edges of the securing hole.

4. The mounting apparatus of claim 3, wherein each of the two elastic securing claws has a blocking flange, the blocking flange engages the securing groove of the securing post.

5. The mounting apparatus of claim 4, wherein the two elastic securing claws are capable of being resiliently deflected by the securing post to clip the securing post therebetween.

6. The mounting apparatus of claim 4, wherein a guiding portion is formed at a side edge of each blocking flange, the guiding portion is configured for the securing post easily entering into an accommodating space defined by the two securing claws.

7. The mounting apparatus of claim 3, wherein the securing post defines a securing hole corresponding to the supporting bracket securing hole, the two mounting holes are configured for a fastener extending through.

8. The mounting apparatus of claim 1, wherein the supporting bracket defines an opening, a chip is disposed on the circuit board and configured to contact with the heat dissipating device via the opening.

9. A heat dissipating device assembly, comprising:
a base plate, at least one securing post protruding from the base plate and defining a support portion;
a circuit board mounted on the base plate;
a supporting bracket with a heat dissipating device disposed thereon, the supporting bracket located above the circuit board; wherein the supporting bracket engages with the securing post without contacting the circuit board, and is supported on the support portion of the securing post to put weight of the supporting bracket with the heat dissipating device on the base plate.

10. The heat dissipating device assembly of claim 9, wherein the securing post defines a securing groove, two elastic securing claws extend from the supporting bracket, the securing posts is accommodated between the two elastic securing claws, and the securing claws engage in the securing groove of the securing post.

11. The heat dissipating device assembly of claim 10, wherein the securing post is cylindrical, the securing groove is defined in a circumference of the securing post, and the supporting portion is formed by a surface defined by the securing groove.

12. The heat dissipating device assembly of claim 10, wherein a mounting hole is defined in the supporting bracket between the two elastic securing claws, and the elastic securing claws extends from opposite sides of the mounting hole periphery.

13. The heat dissipating device assembly of claim 10, wherein a blocking flange is bent from each of the two elastic securing claws, the blocking flange engages in the securing groove of the securing post.

14. The heat dissipating device assembly of claim 13, wherein the two elastic securing claws are capable of being resiliently deflected by the securing post to clip the securing post therebetween.

15. The heat dissipating device assembly of claim 13, wherein a guiding portion is formed at a side edge of each blocking flange, the guiding portion is configured for the securing post easily entering into an accommodating space defined by the two securing claws.

16. The heat dissipating device assembly of claim 12, wherein the securing post defines a securing hole corresponding to the supporting bracket mounting hole, a fastener on the heat dissipating device extends through the two holes.

17. The heat dissipating device assembly claim 9, wherein the supporting bracket defines an opening covered by the heat dissipating device, a chip is disposed on the circuit board, and the chip contact with the heat dissipating device via the opening.

* * * * *